United States Patent
Wang et al.

(10) Patent No.: US 12,396,293 B2
(45) Date of Patent: Aug. 19, 2025

(54) MULTI-ACTIVE AREA SEMICONDUCTOR STRUCTURE AND METHOD FOR MANUFACTURING SAME

(71) Applicants: SUZHOU EVERBRIGHT PHOTONICS CO., LTD., Jiangsu (CN); EVERBRIGHT INSTITUTE OF SEMICONDUCTOR PHOTONICS CO., LTD., Jiangsu (CN)

(72) Inventors: Jun Wang, Suzhou (CN); Yudan Gou, Suzhou (CN); Li Zhou, Suzhou (CN); Yang Cheng, Suzhou (CN); Shaoyang Tan, Suzhou (CN); Lichen Zhang, Suzhou (CN); Bo Li, Suzhou (CN); Yiwen Hu, Suzhou (CN); Dayong Min, Suzhou (CN)

(73) Assignees: SUZHOU EVERBRIGHT PHOTONICS CO., LTD. (CN); EVERBRIGHT INSTITUTE OF SEMICONDUCTOR PHOTONICS CO., LTD. (CN)

( * ) Notice: Subject to any disclaimer, the term of this patent is extended or adjusted under 35 U.S.C. 154(b) by 0 days.

(21) Appl. No.: 17/924,314

(22) PCT Filed: Jul. 20, 2022

(86) PCT No.: PCT/CN2022/106858
§ 371 (c)(1),
(2) Date: Nov. 9, 2022

(87) PCT Pub. No.: WO2023/130711
PCT Pub. Date: Jul. 13, 2023

(65) Prior Publication Data
US 2024/0222547 A1 Jul. 4, 2024

(30) Foreign Application Priority Data
Jan. 4, 2022 (CN) .......................... 20221000451.X

(51) Int. Cl.
*H10H 20/811* (2025.01)
*H10H 20/01* (2025.01)
*H10H 20/824* (2025.01)

(52) U.S. Cl.
CPC ........ *H10H 20/811* (2025.01); *H10H 20/013* (2025.01); *H10H 20/824* (2025.01)

(58) Field of Classification Search
CPC .. H10H 20/811; H10H 20/013; H10H 20/824; H01S 5/343; H01S 5/34; H01S 2304/00
See application file for complete search history.

(56) References Cited

U.S. PATENT DOCUMENTS

2007/0145388 A1  6/2007  Philippens et al.
2018/0342646 A1* 11/2018 Uzawa ................ H10H 20/812

FOREIGN PATENT DOCUMENTS

CN  1588717 A  3/2005
CN  1780004 A  5/2006
(Continued)

OTHER PUBLICATIONS

China National Intellectual Property Adminstration; International Search Report and Written Opinion issued in Int'l App. No. PCT/CN2022/106858; 11 pages.
(Continued)

*Primary Examiner* — Marlon T Fletcher
*Assistant Examiner* — Samuel Jonathan Smith
(74) *Attorney, Agent, or Firm* — MASCHOFF BRENNAN

(57) ABSTRACT

A multi-active area semiconductor structure and a method for manufacturing same. The multi-active area semiconduc-
(Continued)

tor structure includes: a $(2k-1)^{th}$ common confining layer arranged between a $k^{th}$ active layer and a $k^{th}$ tunnel junction and in contact with the $k^{th}$ tunnel junction; and a $2k^{th}$ common confining layer arranged between the $k^{th}$ active layer and a $(k+1)^{th}$ tunnel junction and in contact with the $k^{th}$ tunnel junction, where a forbidden band width of a $k^{th}$ quantum well layer is less than both a forbidden band width of a $k^{th}$ first-semiconductor layer and a forbidden band width of a $k^{th}$ second-semiconductor layer; a total thickness of the $(2k-1)^{th}$ common confining layer and the $2k^{th}$ common confining layer is greater than a critical optical field coupling thickness and less than or equal to twice the critical optical field coupling thickness; and a thickness of the $k^{th}$ quantum well layer is less than or equal to $1/10$ of a thickness of the $(2k-1)^{th}$ common confining layer, and the thickness of the $k^{th}$ quantum well layer is less than or equal to $1/10$ of a thickness of the $2k^{th}$ common confining layer. The multi-active area semiconductor structure has effectively improved light-emission efficiency and reduced optical field crosstalk.

20 Claims, 2 Drawing Sheets

(56) References Cited

FOREIGN PATENT DOCUMENTS

| | | |
|---|---|---|
| CN | 103078252 A | 5/2013 |
| CN | 110880676 A | 3/2020 |
| CN | 112531051 A | 3/2021 |
| DE | 102006010727 A1 | 6/2007 |

OTHER PUBLICATIONS

China National Intellectual Property Adminstration; First Office Action issued in CN App. No. 202210000451X, 18 pages.

* cited by examiner

MULTI-ACTIVE AREA SEMICONDUCTOR STRUCTURE AND METHOD FOR MANUFACTURING SAME

This application claims priority to Chinese patent application No. 202210000451.X, entitled "MULTI-ACTIVE AREA SEMICONDUCTOR STRUCTURE AND METHOD FOR MANUFACTURING SAME", filed with the China National Intellectual Property Administration on Jan. 4, 2022, the disclosure of which is hereby incorporated by reference in its entirety.

TECHNICAL FIELD

The present application relates to the field of semiconductor technologies, and specifically to a multi-active area semiconductor structure and a method for manufacturing same.

BACKGROUND

A light-emitting semiconductor device is a device that produces excited emission by using a certain semiconductor material as a working material. The working principle of the device is implementing particle number inversion of non-equilibrium carriers between energy bands (conduction bands and valence bands) of a semiconductor material or between an energy band of a semiconductor material and an energy level of an impurity (an acceptor or a donor) through certain excitation. Excited emission is produced when a large number of electrons and holes in a particle number inversion state recombine. Light-emitting semiconductor devices are widely used because of small sizes and high electro-optical conversion efficiency.

At present, existing technologies cannot simultaneously improve light-emission efficiency effectively and reduce optical field crosstalk.

SUMMARY OF THE INVENTION

Therefore, a technical problem to be resolved by the present application is to overcome the problem that existing technologies cannot simultaneously improve light-emission efficiency effectively and reduce optical field crosstalk, and a multi-active area semiconductor structure and a method for manufacturing same are provided.

The present application provides a multi-active area semiconductor structure, including: a semiconductor substrate layer; a first active layer to an $N^{th}$ active layer arranged on the semiconductor substrate layer, where N is an integer greater than or equal to 2; a $k^{th}$ tunnel junction arranged between a $k^{th}$ active layer and a $(k+1)^{th}$ active layer, where k is greater than or equal to 1 and less than or equal to N−1; and the $k^{th}$ tunnel junction includes a $k^{th}$ first-semiconductor layer and a $k^{th}$ second-semiconductor layer that are of opposite conductivity types and a $k^{th}$ quantum well layer, the $k^{th}$ second-semiconductor layer is arranged on a side of the $k^{th}$ first-semiconductor layer away from the $k^{th}$ active layer, the $k^{th}$ quantum well layer is arranged between the $k^{th}$ second-semiconductor layer and the $k^{th}$ first-semiconductor layer, and a forbidden band width of the $k^{th}$ quantum well layer is less than both a forbidden band width of the $k^{th}$ first-semiconductor layer and a forbidden band width of the $k^{th}$ second-semiconductor layer; a $(2k−1)^{th}$ common confining layer arranged between the $k^{th}$ active layer and the $k^{th}$ tunnel junction, where the $(2k−1)^{th}$ common confining layer is in contact with the $k^{th}$ tunnel junction; and a $2k^{th}$ common confining layer arranged between the $(k+1)^{th}$ active layer and the $k^{th}$ tunnel junction, where the $2k^{th}$ common confining layer is in contact with the $k^{th}$ tunnel junction, and a conductivity type of the $2k^{th}$ common confining layer is opposite to a conductivity type of the $(2k−1)^{th}$ common confining layer and the same as the conductivity type of the $k^{th}$ second-semiconductor layer, where a total thickness of the $(2k−1)^{th}$ common confining layer and the $2k^{th}$ common confining layer is greater than a critical optical field coupling thickness and less than or equal to twice the critical optical field coupling thickness; and a thickness of the $k^{th}$ quantum well layer is less than or equal to ¹⁄₁₀ of a thickness of the $(2k−1)^{th}$ common confining layer, and the thickness of the $k^{th}$ quantum well layer is less than or equal to ¹⁄₁₀ of a thickness of the $2k^{th}$ common confining layer.

Optionally, the $(2k−1)^{th}$ common confining layer is used for confining optical fields in the $k^{th}$ active layer and the $(k+1)^{th}$ active layer, and the $2k^{th}$ common confining layer is used for confining the optical fields in the $(k+1)^{th}$ active layer and the $k^{th}$ active layer.

Optionally, the critical optical field coupling thickness ranges from 0.3 micrometers to 5 micrometers.

Optionally, the total thickness of the $(2k−1)^{th}$ common confining layer and the $2k^{th}$ common confining layer ranges from 0.4 micrometers to 6 micrometers.

Optionally, the thickness of the $k^{th}$ quantum well layer is less than or equal to 10 nanometers.

Optionally, a doping concentration in the $k^{th}$ quantum well layer is greater than a doping concentration in the $(2k−1)^{th}$ common confining layer and greater than a doping concentration in the $2k^{th}$ common confining layer.

Optionally, the doping concentration in the $k^{th}$ quantum well layer ranges from 5 E18 atom/cm$^3$ to 1 E20 atom/cm$^3$.

Optionally, a material of the $k^{th}$ first-semiconductor layer is the same as a material of the $(2k−1)^{th}$ common confining layer; and a material of the $k^{th}$ second-semiconductor layer is the same as a material of the $2k^{th}$ common confining layer.

Optionally, when the semiconductor substrate layer is a GaAs substrate, the material of the $k^{th}$ first-semiconductor layer and the $(2k−1)^{th}$ common confining layer is $Al_{x1}Ga_{1-x1}As$, $(Al_{x2}Ga_{1-x2})_{0.51}In_{0.49}P$ or $In_{1-x3}Ga_{x3}As_{y1}P_{1-y1}$ doped with P-type conductive ions, and the material of the $k^{th}$ second-semiconductor layer and the $2k^{th}$ common confining layer is $Al_{x1}Ga_{1-x1}As$, $(Al_{x2}Ga_{1-x2})_{0.51}In_{0.49}P$ or $In_{1-x3}Ga_{x3}As_{y1}P_{1-y1}$ doped with N-type conductive ions; and when the semiconductor substrate layer is an InP substrate, the material of the $k^{th}$ first-semiconductor layer and the $(2k−1)^{th}$ common confining layer is InP, $In_{0.53}(Al_{x4}Ga_{1-x4})_{0.47}$As or $In_{1-x5}Ga_{x5}As_{y2}P_{1-y2}$ doped with P-type conductive ions, and the material of the $k^{th}$ second-semiconductor layer and the $2k^{th}$ common confining layer is InP, $In_{0.53}(Al_{x4}Ga_{1-x4})_{0.47}$As or $In_{1-x5}Ga_{x5}As_{y2}P_{1-y2}$ doped with N-type conductive ions.

Optionally, a conductivity type of the $k^{th}$ quantum well layer is an N type, and doped ions in the $k^{th}$ quantum well layer are Te ions or Si ions.

Optionally, a material of the $k^{th}$ quantum well layer is $In_yGa_{1-y}As$ doped with Te ions or Si ions.

Optionally, the semiconductor structure further includes: a lower confining layer arranged between the semiconductor substrate layer and the first active layer; an upper confining layer arranged on a side of the $N^{th}$ active layer away from the semiconductor substrate layer; a first waveguide layer arranged between the first active layer and the lower confining layer; a $2k^{th}$ waveguide layer arranged between the $k^{th}$ active layer and the $(2k−1)^{th}$ common confining layer; and a $(2k+1)^{th}$ waveguide layer arranged between the $(k+1)^{th}$ active layer and the $2k^{th}$ common confining layer.

The present application further provides a method for manufacturing a multi-active area semiconductor structure, including: providing a semiconductor substrate layer; sequentially forming a first active layer to an $N^{th}$ active layer on the semiconductor substrate layer, where N is an integer greater than or equal to 2; forming a $k^{th}$ tunnel junction before a $(k+1)^{th}$ active layer is formed, where k is greater than or equal to 1 and less than or equal to N−1; and the step of forming a $k^{th}$ tunnel junction includes: sequentially forming a $k^{th}$ first-semiconductor layer, a $k^{th}$ quantum well layer, and a $k^{th}$ second-semiconductor layer on a side of a $k^{th}$ active layer away from the semiconductor substrate layer, the $k^{th}$ first-semiconductor layer and the $k^{th}$ second-semiconductor layer are of opposite conductivity types, and a forbidden band width of the $k^{th}$ quantum well layer is less than both a forbidden band width of the $k^{th}$ first-semiconductor layer and a forbidden band width of the $k^{th}$ second-semiconductor layer; forming a $(2k-1)^{th}$ common confining layer on the side of the $k^{th}$ active layer away from the semiconductor substrate layer before the $k^{th}$ tunnel junction is formed, where, after the $k^{th}$ tunnel junction is formed, the $(2k-1)^{th}$ common confining layer is in contact with the $k^{th}$ tunnel junction; and forming a $2k^{th}$ common confining layer on a side of the $k^{th}$ tunnel junction away from the semiconductor substrate layer before the $(k+1)^{th}$ active layer is formed, where the $2k^{th}$ common confining layer is in contact with the $k^{th}$ tunnel junction, and a conductivity type of the $2k^{th}$ common confining layer is opposite to a conductivity type of the $(2k-1)^{th}$ common confining layer and the same as the conductivity type of the $k^{th}$ second-semiconductor layer, where a total thickness of the $(2k-1)^{th}$ common confining layer and the $2k^{th}$ common confining layer is greater than a critical optical field coupling thickness and less than or equal to twice the critical optical field coupling thickness; and a thickness of the $k^{th}$ quantum well layer is less than or equal to $\frac{1}{10}$ of a thickness of the $(2k-1)^{th}$ common confining layer, and the thickness of the $k^{th}$ quantum well layer is less than or equal to $\frac{1}{10}$ of a thickness of the $2k^{th}$ common confining layer.

Optionally, the $(2k-1)^{th}$ common confining layer is used for confining optical fields in the $k^{th}$ active layer and the $(k+1)^{th}$ active layer, and the $2k^{th}$ common confining layer is used for confining the optical fields in the $(k+1)^{th}$ active layer and the $k^{th}$ active layer.

Optionally, doped ions in the $k^{th}$ quantum well layer are Te ions; the step of forming a $k^{th}$ quantum well layer includes: sequentially and consecutively performing a first stage and a second stage, where a temperature in the first stage is constant, a temperature in the second stage increases as a growth time increases, and a temperature at a starting moment of the second stage is the same as the temperature in the first stage; and a flow rate of a Te doping gas source in a chamber in the first stage is constant, a flow rate of the Te doping gas source in the chamber in the second stage decreases as the growth time increases, and a flow rate of the Te doping gas source at the starting moment of the second stage is the same as the flow rate of the Te doping gas source in the first stage; and the method for manufacturing the multi-active area semiconductor structure further includes: introducing the Te doping gas source into the chamber in an end stage of forming the $k^{th}$ first-semiconductor layer, where a flow rate of the Te doping gas source introduced into the chamber increases as the growth time increases, and a flow rate of the Te doping gas source corresponding to an end moment of the end stage of forming the $k^{th}$ first-semiconductor layer is the same as the flow rate of the Te doping gas source in the first stage.

Optionally, a duration of the end stage of forming the $k^{th}$ first-semiconductor layer ranges from 1 second to 30 seconds; and a duration of the second stage ranges from 30 seconds to 1 minute.

Optionally, a temperature at a termination moment of the second stage is increased by 10% to 30% with respect to the temperature at the starting moment of the second stage.

Optionally, a flow rate of the Te doping gas source corresponding to a termination moment of the second stage is zero; and the flow rate of the Te doping gas source introduced in the end stage of forming the $k^{th}$ first-semiconductor layer increases from zero until becoming the same as the flow rate of the Te doping gas source in the first stage.

Optionally, the flow rate of the Te doping gas source in the first stage ranges from 10 sccm to 20 sccm.

Optionally, doped ions in the $k^{th}$ quantum well layer are Te ions, and Te ions are doped in the $k^{th}$ second-semiconductor layer; in a process of forming the $k^{th}$ quantum well layer, a temperature is constant and a flow rate of a Te doping gas source is constant; the step of forming a $k^{th}$ second-semiconductor layer includes: sequentially and consecutively performing a third stage and a fourth stage, where a temperature in the third stage is constant, a temperature in the fourth stage increases as a growth time increases, and a temperature at a starting moment of the fourth stage is the same as the temperature in the third stage; and a flow rate of the Te doping gas source in a chamber in the third stage is constant, a flow rate of the Te doping gas source in the chamber in the fourth stage decreases as the growth time increases, and a flow rate of the Te doping gas source at the starting moment of the fourth stage is the same as the flow rate of the Te doping gas source in the third stage; and the method for manufacturing the multi-active area semiconductor structure further includes: introducing the Te doping gas source into the chamber in an end stage of forming the $k^{th}$ first-semiconductor layer, where a flow rate of the Te doping gas source introduced into the chamber increases as the growth time increases, and a flow rate of the Te doping gas source corresponding to an end moment of the end stage of forming the $k^{th}$ first-semiconductor layer is the same as the flow rate of the Te doping gas source used in the process of forming the $k^{th}$ quantum well layer.

Optionally, the method further includes: forming a lower confining layer on the semiconductor substrate layer before the first active layer is formed; forming a first waveguide layer on a side of the lower confining layer away from the semiconductor substrate layer; forming a $2k^{th}$ waveguide layer on the side of the $k^{th}$ active layer away from the semiconductor substrate layer before the $(2k-1)^{th}$ common confining layer is formed; forming a $(2k+1)^{th}$ waveguide layer on a side of the $2k^{th}$ common confining layer away from the semiconductor substrate layer before the $(k+1)^{th}$ active layer is formed; and forming an upper confining layer on a side of the $N^{th}$ active layer away from the semiconductor substrate layer.

The technical solutions of the present application have the following beneficial effects.

In the multi-active area semiconductor structure provided in the technical solution of the present application, a forbidden band width of a $k^{th}$ quantum well layer is less than both a forbidden band width of a $k^{th}$ first-semiconductor layer and a forbidden band width of a $k^{th}$ second-semiconductor layer in a $k^{th}$ tunnel junction, so that a tunneling probability of the $k^{th}$ tunnel junction can be increased, thereby reducing a junction resistance. A $(2k-1)^{th}$ common confining layer is provided between a $k^{th}$ active layer and the $k^{th}$ tunnel junction, and a $2k^{th}$ common confining layer is provided between a $(k+1)^{th}$ active layer and the $k^{th}$ tunnel junction. Because both the $(2k-1)^{th}$ common confining layer and the $2k^{th}$ common confining layer are in contact with the $k^{th}$ tunnel junction, some ohmic contact layers and some buffer layers disposed between the first active layer and an $N^{th}$ active layer are omitted. Because some ohmic contact layers and some buffer layers disposed between the first active layer and the $N^{th}$ active layer are omitted, a total thickness of the $(2k-1)^{th}$ common confining layer and the $2k^{th}$ common confining layer is greater than a critical optical field coupling thickness and less than or equal to twice the critical optical field coupling thickness. In this way, the thickness of the multi-active area semiconductor structure is effectively reduced. As the thickness of the multi-active area semiconductor structure is reduced, the resistance of the multi-active area semiconductor structure is effectively reduced, and a spacing between spots emitted by adjacent active layers is reduced, thereby improving the optical performance. Next, the forbidden band width of the $k^{th}$ quantum well layer is less than both the forbidden band width of the $k^{th}$ first-semiconductor layer and the forbidden band width of the $k^{th}$ second-semiconductor layer in the $k^{th}$ tunnel junction. Therefore, a refractive index of the $k^{th}$ quantum well layer is greater than a refractive index of the $k^{th}$ first-semiconductor layer and a refractive index of the $k^{th}$ second-semiconductor layer. The refractive index of the $k^{th}$ quantum well layer is relatively large. The thickness of the $k^{th}$ quantum well layer is less than or equal to $1/10$ of the thickness of the $(2k-1)^{th}$ common confining layer, and the thickness of the $k^{th}$ quantum well layer is less than or equal to $1/10$ of the thickness of the $2k^{th}$ common confining layer. In this way, the thickness of the $k^{th}$ quantum well layer is extremely small. The $k^{th}$ quantum well layer with an extremely small thickness can avoid crosstalk in optical fields on two sides of the $k^{th}$ tunnel junction, thereby avoiding a decrease in laser power and a change in a divergence angle. In summary, the light-emission efficiency is effectively improved, and the optical field crosstalk is effectively reduced.

BRIEF DESCRIPTION OF THE DRAWINGS

To describe the technical solutions in specific embodiments of the present application or the prior art more clearly, the following briefly introduces the accompanying drawings required for describing the specific embodiments or the prior art. Apparently, the accompanying drawings in the following description show some embodiments of the present application, and a person of ordinary skill in the art may still derive other drawings from these accompanying drawings without creative efforts.

DETAILED DESCRIPTION

Figure 1:
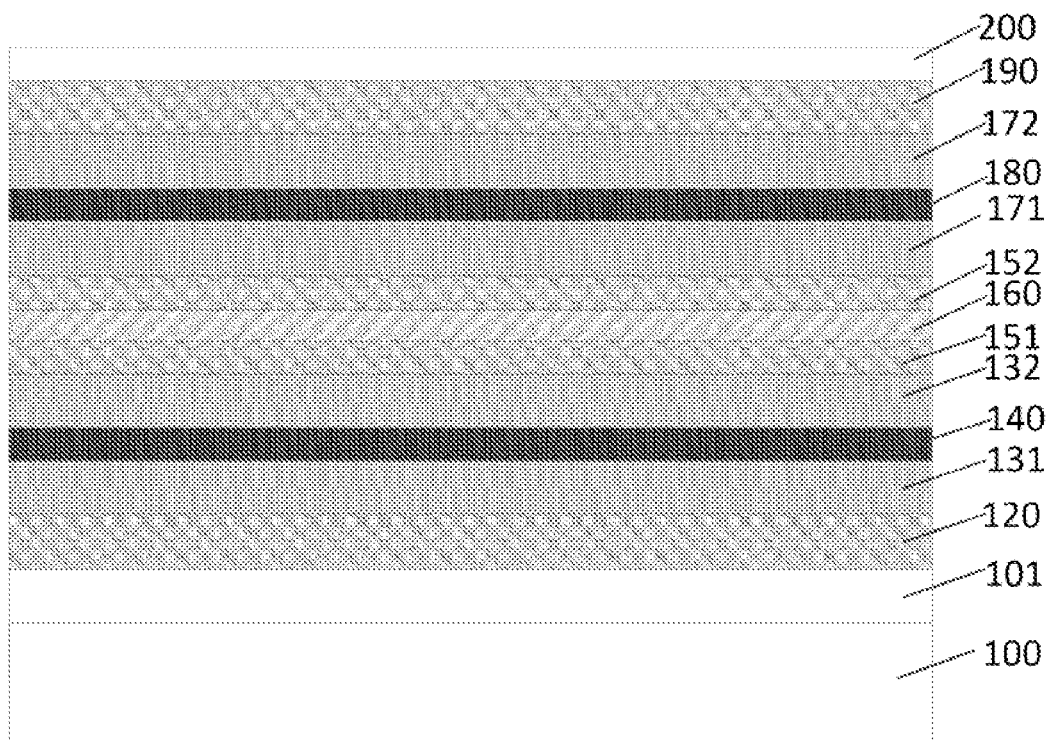
FIG. 1 is a schematic diagram of a multi-active area semiconductor structure according to an embodiment of the present application.

The output power of a semiconductor laser is generally increased by increasing an injection current. The internal quantum efficiency of a conventional quantum well type semiconductor laser with a single active area remains less than 1. However, as the current increases, the thickness of a power supply transmission lead required for the semiconductor laser needs to be increased to reduce the resistance to maintain the reliability of power supply. A nearly double power output can be reached at a single injection current by using a double active area semiconductor laser, thereby reducing an operating current. In the epitaxial structure of the double active area semiconductor laser, two active areas are vertically stacked through one single epitaxial growth. An upper active area and a lower active area are connected in series by an inversely highly doped PN tunnel junction. After one carrier has passed through the first active area to participate in recombination and light emission, the inversion is completed at the tunnel junction and can also participate in recombination and light emission in the second active area. A tunnel structure in the double active area semiconductor laser includes a first doped semiconductor layer and a second doped semiconductor layer that are of opposite conductivity types.

The requirements for a good tunnel junction in the double active area semiconductor laser are as follows: forbidden band widths of the first doped semiconductor layer and the second doped semiconductor layer need to be small. If the forbidden band widths of the first doped semiconductor layer and the second doped semiconductor layer are large, the tunnel junction has a low tunneling probability, that is, the tunnel junction resistance is large. The first doped semiconductor layer and the second doped semiconductor layer need to be heavily doped into a degenerate semiconductor. An interface between the first doped semiconductor layer and the second doped semiconductor layer needs to be steep, with low impurity diffusion and a thin depletion layer. It is only in this way that a tunnel junction with a low series resistance can be formed, or otherwise, a tunnel junction with a high resistance is formed, which in one aspect directly causes an increase in the operating voltage of the double active area semiconductor laser, resulting in reduced electro-optical efficiency, and in another aspect increases the waste heat at the tunnel junction, resulting in deteriorated performance of the double active area semiconductor laser.

In the epitaxial structure of a multi-active area semiconductor laser, multiple (Q) complete single active area structures are generally connected by a tunnel junction. In this way, a total epitaxial thickness of a multi-active area structure is Q times the thickness of a single active area and Q times the thickness of the tunnel junction. The total thickness is relatively large. The series resistance of the multi-active area semiconductor laser is equal to the resistance of Q complete single active area semiconductor lasers plus the resistance of the tunnel junction. Such a design is a simple structural stack and has both a thickness and a resistance Q times the original.

In addition, in terms of optics, a total epitaxial thickness of a relatively thick multi-active area structure represents a larger distance between corresponding light emission fields of active areas. During optical shaping, the dispersion angle in a vertical direction is relatively large, which affects the optical performance. Especially, a LIDAR chip requires relatively large optical indicators.

To reduce the total thickness of the epitaxial structure of a multi-active area semiconductor laser with a particular quantity of active areas, in one method, a confining layer is placed in direct contact with a tunnel junction, some ohmic contact layers and buffer layers are omitted, and the thickness of the confining layer is reduced.

However, the foregoing structure causes crosstalk in optical fields on two sides of a tunnel junction, to cause changes in a laser mode and a divergence angle.

Based on this, the present application provides a multi-active area semiconductor structure, including: a $(2k-1)^{th}$ common confining layer arranged between the $k^{th}$ active layer and the $k^{th}$ tunnel junction, where the $(2k-1)^{th}$ common confining layer is in contact with the $k^{th}$ tunnel junction; and a $2k^{th}$ common confining layer arranged between the $(k+1)^{th}$ active layer and the $k^{th}$ tunnel junction, where the $2k^{th}$ common confining layer is in contact with the $k^{th}$ tunnel junction, and where a forbidden band width of a $k^{th}$ quantum well layer is less than both a forbidden band width of a $k^{th}$ first-semiconductor layer and a forbidden band width of a $k^{th}$ second-semiconductor layer; a total thickness of the $(2k-1)^{th}$ common confining layer and the $2k^{th}$ common confining layer is greater than a critical optical field coupling thickness and less than or equal to twice the critical optical field coupling thickness; and a thickness of the $k^{th}$ quantum well layer is less than or equal to $1/10$ of a thickness of the $(2k-1)^{th}$ common confining layer, and the thickness of the $k^{th}$ quantum well layer is less than or equal to $1/10$ of a thickness of the $2k^{th}$ common confining layer. The multi-active area semiconductor structure has effectively improved light-emission efficiency and reduced optical field crosstalk.

The following clearly and completely describes the technical solutions in the present application with reference to the accompanying drawings. Apparently, the described embodiments are some rather than all of the embodiments of the present application. All other embodiments obtained by persons of ordinary skill in the art based on the embodiments of the present application without creative efforts shall fall within the protection scope of the present application.

In the description of the present application, it needs to be understood that orientation or location relationships indicated by terms "center", "up", "down", "left", "right", "vertical", "horizontal", "inside", and "outside" are based on orientation or location relationships shown in the accompanying drawings, and are only used to facilitate description of the present application and simplify description, but are not used to indicate or imply that the apparatuses or elements must have specific orientations or are constructed and operated by using specific orientations, and therefore, cannot be understood as a limit to the present application. In addition, the terms "first", "second", and "third" are used only for description, but are not intended to indicate or imply relative importance.

In addition, the technical features involved in different embodiments of the present application described below can be combined with each other as long as they do not constitute a conflict between them.

An embodiment of the present application provides a multi-active area semiconductor structure, referring to FIG. 1, including:
a semiconductor substrate layer 100;
a first active layer 140 to an $N^{th}$ active layer arranged on the semiconductor substrate layer 100, where N is an integer greater than or equal to 2;
a $k^{th}$ tunnel junction arranged between a $k^{th}$ active layer and a $(k+1)^{th}$ active layer, where k is greater than or equal to 1 and less than or equal to N−1; and the $k^{th}$ tunnel junction includes a $k^{th}$ first-semiconductor layer and a $k^{th}$ second-semiconductor layer that are of opposite conductivity types and a $k^{th}$ quantum well layer, the $k^{th}$ second-semiconductor layer is arranged on a side of the $k^{th}$ first-semiconductor layer away from the $k^{th}$ active layer, the $k^{th}$ quantum well layer is arranged between the $k^{th}$ second-semiconductor layer and the $k^{th}$ first-semiconductor layer, and a forbidden band width of the $k^{th}$ quantum well layer is less than both a forbidden band width of the $k^{th}$ first-semiconductor layer and a forbidden band width of the $k^{th}$ second-semiconductor layer;

a $(2k-1)^{th}$ common confining layer arranged between the $k^{th}$ active layer and the $k^{th}$ tunnel junction, where the $(2k-1)^{th}$ common confining layer is in contact with the $k^{th}$ tunnel junction; and a $2k^{th}$ common confining layer arranged between the $(k+1)^{th}$ active layer and the $k^{th}$ tunnel junction, where the $2k^{th}$ common confining layer is in contact with the $k^{th}$ tunnel junction, and a conductivity type of the $2k^{th}$ common confining layer is opposite to a conductivity type of the $(2k-1)^{th}$ common confining layer and the same as the conductivity type of the $k^{th}$ second-semiconductor layer, where a total thickness of the $(2k-1)^{th}$ common confining layer and the $2k^{th}$ common confining layer is greater than a critical optical field coupling thickness and less than or equal to twice the critical optical field coupling thickness; and a thickness of the $k^{th}$ quantum well layer is less than or equal to $1/10$ of a thickness of the $(2k-1)^{th}$ common confining layer, and the thickness of the $k^{th}$ quantum well layer is less than or equal to $1/10$ of a thickness of the $2k^{th}$ common confining layer.

In this embodiment, because both the $(2k-1)^{th}$ common confining layer and the $2k^{th}$ common confining layer are in contact with the $k^{th}$ tunnel junction, some ohmic contact layers and some buffer layers disposed between the first active layer and an $N^{th}$ active layer are omitted. Because some ohmic contact layers and some buffer layers disposed between the first active layer and the $N^{th}$ active layer are omitted, a total thickness of the $(2k-1)^{th}$ common confining layer and the $2k^{th}$ common confining layer is greater than a critical optical field coupling thickness and less than or equal to twice the critical optical field coupling thickness. In this way, the thickness of the multi-active area semiconductor structure is effectively reduced. As the thickness of the multi-active area semiconductor structure is reduced, the resistance of the multi-active area semiconductor structure is effectively reduced, and a spacing between spots emitted by adjacent active layers is reduced, thereby improving the optical performance. Next, the forbidden band width of the $k^{th}$ quantum well layer is less than both the forbidden band width of the $k^{th}$ first-semiconductor layer and the forbidden band width of the $k^{th}$ second-semiconductor layer in the $k^{th}$ tunnel junction. Therefore, a refractive index of the $k^{th}$ quantum well layer is greater than a refractive index of the $k^{th}$ first-semiconductor layer and a refractive index of the $k^{th}$ second-semiconductor layer. The refractive index of the $k^{th}$ quantum well layer is relatively large. The thickness of the $k^{th}$ quantum well layer is less than or equal to $1/10$ of the thickness of the $(2k-1)^{th}$ common confining layer, and the thickness of the $k^{th}$ quantum well layer is less than or equal to $1/10$ of the thickness of the $2k^{th}$ common confining layer. In this way, the thickness of the $k^{th}$ quantum well layer is extremely small. The $k^{th}$ quantum well layer with an extremely small thickness can avoid crosstalk in optical fields on two sides of the $k^{th}$ tunnel junction, thereby avoiding changes in a laser mode and a divergence angle.

In this embodiment, an example in which the multi-active area semiconductor structure is an edge-emitting multi-active area semiconductor laser is used for description.

In this embodiment, the semiconductor substrate layer is a gallium arsenide substrate layer. It needs to be noted that in other embodiments, the semiconductor substrate layer may be a substrate layer made of another material.

The multi-active area semiconductor structure further includes: a lower confining layer 120 arranged between the semiconductor substrate layer 100 and the first active layer 140; an upper confining layer 190 arranged on a side of the $N^{th}$ active layer away from the semiconductor substrate layer 100; a first waveguide layer 131 arranged between the first active layer 140 and the lower confining layer 120; a $2k^{th}$ waveguide layer arranged between the $k^{th}$ active layer and the $(2k-1)^{th}$ common confining layer; and a $(2k+1)^{th}$ waveguide layer arranged between the $(k+1)^{th}$ active layer and the $2k^{th}$ common confining layer.

The multi-active area semiconductor structure further includes: a buffer layer 101 arranged between the lower confining layer 120 and the semiconductor substrate layer 100; and an ohmic contact semiconductor layer 200 arranged on a surface of a side of the upper confining layer 190 away from the semiconductor substrate layer 100.

In this embodiment, the semiconductor substrate layer is a GaAs substrate layer, and the buffer layer is a GaAs buffer layer. In other embodiments, the semiconductor substrate layer is an InP substrate layer, and the buffer layer is an InP buffer layer.

The $(2k-1)^{th}$ common confining layer and the $2k^{th}$ common confining layer between the $k^{th}$ active layer and the $(k+1)^{th}$ active layer are used as one complete common confining layer. The $(2k-1)^{th}$ common confining layer confines both an optical field in the $k^{th}$ active layer and an optical field in the $(k+1)^{th}$ active layer. The $2k^{th}$ common confining layer confines both the optical field in the $(k+1)^{th}$ active layer and the optical field in the $k^{th}$ active layer. In this way, it can be set that both the $(2k-1)^{th}$ common confining layer and the $2k^{th}$ common confining layer have relatively small thicknesses, so that the resistance can be reduced.

The total thickness of the $(2k-1)^{th}$ common confining layer and the $2k^{th}$ common confining layer is greater than the critical optical field coupling thickness and less than or equal to twice the critical optical field coupling thickness. The physical meaning of the critical optical field coupling thickness is that in a case that no tunnel junction is disposed in the multi-active area semiconductor structure, when the total thickness of the $(2k-1)^{th}$ common confining layer and the $2k^{th}$ common confining layer is equal to the critical optical field coupling thickness, the optical field in the $k^{th}$ active layer and the optical field in the $(k+1)^{th}$ active layer are in a coupled critical state.

It needs to be noted that in the prior art, the thickness of a single-layer N-type confining layer is greater than the critical optical field coupling thickness, the thickness of a single-layer P-type confining layer is greater than the critical optical field coupling thickness, and a total thickness of the single-layer N-type confining layer and the single-layer P-type confining layer is greater than twice the critical optical field coupling thickness.

In this embodiment, the critical optical field coupling thickness ranges from 0.3 micrometers to 5 micrometers, and is, for example, 0.3 micrometers, 1 micrometer, 2 micrometers, 3 micrometers, 4 micrometers or 5 micrometers. It needs to be noted that the critical optical field coupling thickness may vary in different multi-active area semiconductor structures.

In an embodiment, the total thickness of the $(2k-1)^{th}$ common confining layer and the $2k^{th}$ common confining layer ranges from 0.4 micrometers to 6 micrometers. The thickness of the $(2k-1)^{th}$ common confining layer ranges from 0.2 micrometers to 3 micrometers, and is, for example, 0.2 micrometers, 0.5 micrometers, 0.8 micrometers, 1 micrometer, 1.5 micrometers, 2 micrometers, 2.5 micrometers or 3 micrometers. The thickness of the $2k^{th}$ common confining layer ranges from 0.2 micrometers to 3 micrometers, and is, for example, 0.2 micrometers, 0.5 micrometers, 0.8 micrometers, 1 micrometer, 1.5 micrometers, 2 micrometers, 2.5 micrometers or 3 micrometers.

In this embodiment, the thickness of the $(2k-1)^{th}$ common confining layer is equal to the thickness of the $2k^{th}$ common confining layer. In other embodiments, the thickness of the $(2k-1)^{th}$ common confining layer is not equal to the thickness of the $2k^{th}$ common confining layer.

In this embodiment, when the semiconductor substrate layer 100 is a GaAs substrate, the material of the $(2k-1)^{th}$ common confining layer is $Al_{x1}Ga_{1-x1}As$, $(Al_{x2}Ga_{1-x2})_{0.51}In_{0.49}P$ or $In_{1-x3}Ga_{x3}As_{y1}P_{1-y1}$ doped with P-type conductive ions. When the semiconductor substrate layer 100 is a GaAs substrate, the material of the $2k^{th}$ common confining layer is $Al_{x1}Ga_{1-x1}As$, $(Al_{x2}Ga_{1-x2})_{0.51}In_{0.49}P$ or $In_{1-x3}Ga_{x3}As_{y1}P_{1-y1}$ doped with N-type conductive ions. x1 ranges from 0.2 to 0.9, x2 ranges from 0 to 1, x3 ranges from 0.52 to 1, and y1 ranges from 0 to 1.

In other embodiments, when the semiconductor substrate layer 100 is an InP substrate, the material of the $(2k-1)^{th}$ common confining layer is InP, $In_{0.53}(Al_{x4}Ga_{1-x4})_{0.47}As$ or $In_{1-x5}Ga_{x5}As_{y2}P_{1-y2}$ doped with P-type conductive ions. When the semiconductor substrate layer 100 is an InP substrate, the material of the $2k^{th}$ common confining layer is InP, $In_{0.53}(Al_{x4}Ga_{1-x4})_{0.47}As$ or $In_{1-x5}Ga_{x5}As_{y2}P_{1-y2}$ doped with N-type conductive ions. X4 ranges from 0 to 1, x5 ranges from 0 to 0.47, and y2 ranges from 0 to 1.

A forbidden band width of the $(2k-1)^{th}$ common confining layer is greater than a forbidden band width of the buffer layer 101 and is greater than a forbidden band width of the ohmic contact semiconductor layer 200. A forbidden band width of the $2k^{th}$ common confining layer is greater than the forbidden band width of the buffer layer 101 and is greater than the forbidden band width of the ohmic contact semiconductor layer 200. That is, the forbidden band width of the $(2k-1)^{th}$ common confining layer and the forbidden band width of the $2k^{th}$ common confining layer are both relatively large. Correspondingly, a refractive index of the $(2k-1)^{th}$ common confining layer and a refractive index of the $2k^{th}$ common confining layer are both relatively small.

In this embodiment, it is set that the material of the $k^{th}$ first-semiconductor layer is the same as the material of the $(2k-1)^{th}$ common confining layer; and it is set that the material of the $k^{th}$ second-semiconductor layer is the same as a material of the $2k^{th}$ common confining layer. In this way, the refractive index of the $k^{th}$ first-semiconductor layer in the $k^{th}$ tunnel junction is relatively small, the refractive index of the $k^{th}$ second-semiconductor layer in the $k^{th}$ tunnel junction is relatively small, and the $k^{th}$ first-semiconductor layer and the $k^{th}$ second-semiconductor layer have relatively low impact on the optical field in the $k^{th}$ active layer and the optical field in the $(k+1)^{th}$ active layer.

In this embodiment, when the semiconductor substrate layer is a GaAs substrate, the material of the $k^{th}$ first-semiconductor layer and the $(2k-1)^{th}$ common confining layer is $Al_{x1}Ga_{1-x1}As$, $(Al_{x2}Ga_{1-x2})_{0.51}In_{0.49}P$ or $In_{1-x3}Ga_{x3}As_{y1}P_{1-y1}$ doped with P-type conductive ions, and the material of the $k^{th}$ second-semiconductor layer and the $2k^{th}$ common confining layer is $Al_{x1}Ga_{1-x1}As$, $(Al_{x2}Ga_{1-x2})_{0.51}In_{0.49}P$ or $In_{1-x3}Ga_{x3}As_{y1}P_{1-y1}$ doped with N-type conductive ions; and when the semiconductor substrate layer is an InP substrate, the material of the $k^{th}$ first-semiconductor layer and the $(2k-1)^{th}$ common confining layer is InP, $In_{0.53}(Al_{x4}Ga_{1-x4})_{0.47}As$ or $In_{1-x5}Ga_{x5}As_{y2}P_{1-y2}$ doped with P-type conductive ions, and the material of the $k^{th}$ second-semiconductor layer and the $2k^{th}$ common confining layer is InP, $In_{0.53}(Al_{x4}Ga_{1-x4})_{0.47}As$ or $In_{1-x5}Ga_{x5}As_{y2}P_{1-y2}$ doped with N-type conductive ions.

In this embodiment, the forbidden band width of the $(2k-1)^{th}$ common confining layer and the forbidden band width of the $2k^{th}$ common confining layer are both relatively large. Therefore, the $k^{th}$ quantum well layer is inserted between the $(2k-1)^{th}$ common confining layer and the $2k^{th}$ common confining layer. The forbidden band width of the $k^{th}$ quantum well layer is less than both the forbidden band width of the $(2k-1)^{th}$ common confining layer and the forbidden band width of the $2k^{th}$ common confining layer. Therefore, the forbidden band width of the $k^{th}$ quantum well layer is relatively small. In this way, a tunneling probability of the $k^{th}$ tunnel junction is greatly increased, thereby reducing the resistance of the $k^{th}$ tunnel junction.

In an embodiment, the material of the $k^{th}$ quantum well layer is $In_yGa_{1-y}As$ doped with conductive ions, where y ranges from 0 to 0.2, and is, for example, 0.05, 0.1, 0.15 or 0.2. A forbidden band width of $In_yGa_{1-y}As$ is less than a forbidden band width of $Al_{x1}Ga_{1-x1}As$, the forbidden band width of $In_yGa_{1-y}As$ is less than a forbidden band width of $(Al_{x2}Ga_{1-x2})_{0.51}In_{0.49}$, the forbidden band width of $In_yGa_{1-y}As$ is less than a forbidden band width of $In_{1-x3}Ga_{x3}As_{y1}P_{1-y1}$, the forbidden band width of $In_yGa_{1-y}As$ is less than a forbidden band width of InP, the forbidden band width of $In_yGa_{1-y}As$ is less than a forbidden band width of $In_{0.53}(Al_{x4}Ga_{1-x4})_{0.47}As$, and the forbidden band width of $In_yGa_{1-y}As$ is less than a forbidden band width of $In_{1-x5}Ga_{x5}As_{y2}P_{1-y2}$.

In this embodiment, the benefit of the conductivity type of the $k^{th}$ quantum well layer being the conductivity type of the $k^{th}$ second-semiconductor layer lies in that through the doping of Te ions in the N-type $k^{th}$ quantum well layer, it is easily implemented that an interface between the $k^{th}$ quantum well layer and the $k^{th}$ second-semiconductor layer is steep, and the $k^{th}$ quantum well layer and the $k^{th}$ second-semiconductor layer are uniformly doped.

In this embodiment, the conductivity type of the $k^{th}$ quantum well layer and the conductivity type of the $k^{th}$ second-semiconductor layer are N types, and a conductivity type of the $k^{th}$ first-semiconductor layer is a P type. It needs to be noted that in other embodiments, the conductivity type of the $k^{th}$ quantum well layer may be consistent with the conductivity type of the $k^{th}$ first-semiconductor layer, and the conductivity type of the $k^{th}$ quantum well layer and the conductivity type of the $k^{th}$ first-semiconductor layer are P types.

In an embodiment, a conductivity type of the $k^{th}$ quantum well layer is an N type, and doped ions in the $k^{th}$ quantum well layer are Te ions. In another embodiment, a conductivity type of the $k^{th}$ quantum well layer is an N type, and doped ions in the $k^{th}$ quantum well layer are Si ions.

The thickness of the $k^{th}$ quantum well layer is extremely small. The $k^{th}$ quantum well layer with an extremely small thickness can compensate for the impact of a high refractive index of the $k^{th}$ quantum well layer on crosstalk in optical fields on two sides of the $k^{th}$ tunnel junction, to prevent the $k^{th}$ quantum well layer with a high refractive index from causing crosstalk impact on the optical fields on the two sides of the $k^{th}$ tunnel junction.

In a specific embodiment, the thickness of the $k^{th}$ quantum well layer is less than or equal to 10 nanometers, specifically ranges from 1 nanometer to 10 nanometers, and is, for example, 1 nanometer, 2 nanometers, 3 nanometers, 4 nanometers, 5 nanometers, 6 nanometers, 7 nanometers, 8 nanometers, 9 nanometers or 10 nanometers.

In this embodiment, after the thickness of the $k^{th}$ quantum well layer decreases, to keep the effect of increasing the tunneling probability of the $k^{th}$ tunnel junction by the $k^{th}$ quantum well layer, a doping concentration in the $k^{th}$ quantum well layer needs to be increased, the steepness between the $k^{th}$ quantum well layer and the $k^{th}$ second-semiconductor layer is relatively large, and the steepness between the $k^{th}$ quantum well layer and the $k^{th}$ first-semiconductor layer is relatively large.

In this embodiment, the doping concentration in the $k^{th}$ quantum well layer is greater than a doping concentration in the $(2k-1)^{th}$ common confining layer and greater than a doping concentration in the $2k^{th}$ common confining layer.

In an embodiment, the doping concentration in the $k^{th}$ quantum well layer ranges from 5 E18 atom/cm$^3$ to 1 E20 atom/cm$^3$, and is, for example, 5 E18 atom/cm$^3$, 1 E19 atom/cm$^3$ or 1 E20 atom/cm$^3$.

The doped ions in the $k^{th}$ quantum well layer are Te ions, and the Te ions have a relatively large radius. Therefore, while the doping concentration in the $k^{th}$ quantum well layer is relatively high, low diffusibility is provided. The saturated doping concentration of Te ions is relatively high. It needs to be noted that in this embodiment the doped ions in the $k^{th}$ quantum well layer only includes Te ions.

In this embodiment, in a thickness direction of the $k^{th}$ quantum well layer, and the doping concentration of the Te ions in the $k^{th}$ quantum well layer is uniform. In this way, it can be ensured that the $k^{th}$ quantum well layer and the $k^{th}$ first-semiconductor layer have a steep doping interface, and a junction resistance is relatively small.

It needs to be noted that in other embodiments, the doped ions in the $k^{th}$ quantum well layer are Te ions, and Te ions are doped in the $k^{th}$ second-semiconductor layer.

In this embodiment, an example in which N is equal to 2 is used for description.

When N is equal to 2, the multi-active area semiconductor structure includes: a semiconductor substrate layer 100; a buffer layer 101 arranged on the semiconductor substrate layer 100; a lower confining layer 120 arranged on a side of the buffer layer 101 away from the semiconductor substrate layer 100; a first waveguide layer 131 arranged on a side of the lower confining layer 120 away from the semiconductor substrate layer 100; a first active layer 140 arranged on a side of the first waveguide layer 131 away from the semiconductor substrate layer 100; a second waveguide layer 132 arranged on a side of the first active layer 140 away from the semiconductor substrate layer 100; a first common confining layer 151 arranged on a side of the second waveguide layer 132 away from the semiconductor substrate layer 100; and a first tunnel junction 160 arranged on a side of the first common confining layer 151 away from the first active layer 140 and in contact with the first common confining layer 151, where the first tunnel junction 160 includes: a first first-semiconductor layer and a first second-semiconductor layer that are of opposite conductivity types and a first quantum well layer, a forbidden band width of the first quantum well layer is less than both a forbidden band width of the first first-semiconductor layer and a forbidden band width of the first second-semiconductor layer, the first second-semiconductor layer is arranged on a side of the first first-semiconductor layer away from the first active layer 140, the first quantum well layer is arranged between the first second-semiconductor layer and the first first-semiconductor layer, and the first first-semiconductor layer is in contact with the first common confining layer 151; a second common confining layer 152 arranged on a side of the first tunnel junction 160 away from the first active layer 140 and in contact with the first tunnel junction 160, where the second common confining layer 152 is in contact with the first second-semiconductor layer; a third waveguide layer 171 arranged on a side of the second common confining layer 152 away from the first tunnel junction 160; a second active layer 180 arranged on a side of the third waveguide layer 171 away from the second common confining layer 152; a fourth waveguide layer 172 arranged on a side of the second active layer 180 away from the third waveguide layer 171; an upper confining layer 190 arranged on a side of the fourth waveguide layer 172 away from the second active layer 180; and an ohmic contact semiconductor layer 200 arranged on a side of the upper confining layer 190 away from the second active layer 180.

A total thickness of the first common confining layer 151 and the second common confining layer 152 is less than the critical optical field coupling thickness. A conductivity type of the first common confining layer 151 is opposite to a conductivity type of the second common confining layer 152. The first common confining layer 151 and the first first-semiconductor layer have the same conductivity type, and the second common confining layer 152 and the first second-semiconductor layer have the same conductivity type.

The thickness of the first quantum well layer is less than or equal to 1/10 of the thickness of the first common confining layer 151, and the thickness of the first quantum well layer is less than or equal to 1/10 of the thickness of the second common confining layer 152.

In other embodiments, N may be another integer greater than or equal to 3.

Figure 2:
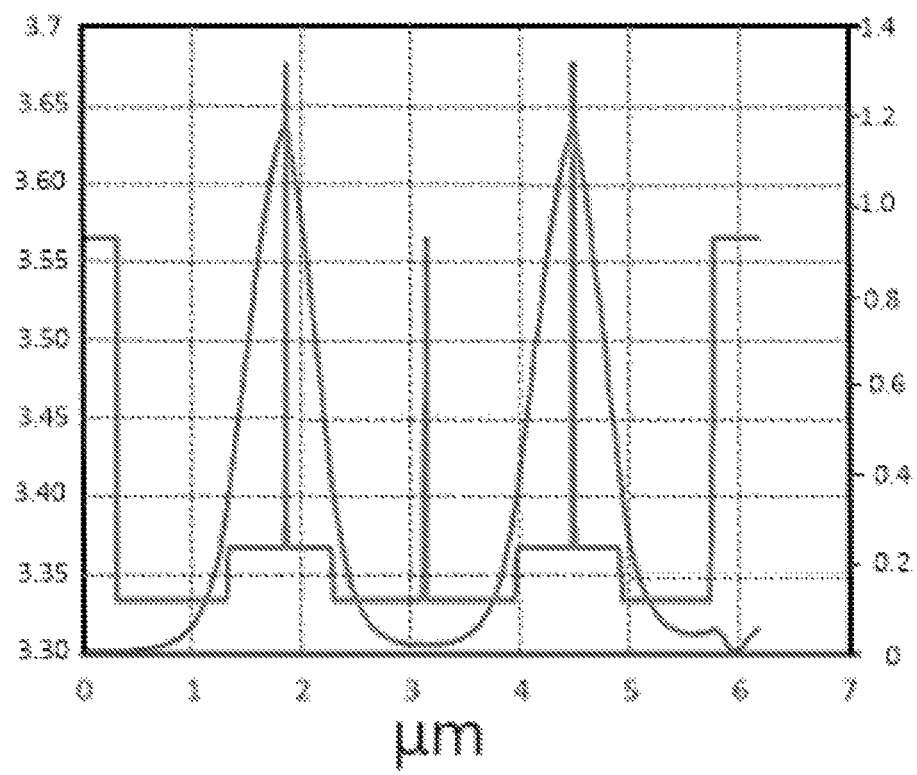
FIG. 2 is a diagram of optical field distribution a multi-active area semiconductor structure according to an embodiment of the present application.

FIG. 2 is a diagram of optical field distribution a multi-active area semiconductor structure according to an embodiment of the present application. Corresponding N in FIG. 2 is 2. A horizontal axis in FIG. 2 is a position of the multi-active area semiconductor structure in an epitaxial thickness direction. The unit of the horizontal axis in FIG. 2 is μm. There are sequentially from left to the right on the horizontal axis the buffer layer 101, the lower confining layer 120, the first waveguide layer 131, the first active layer 140, the second waveguide layer 132, the first common confining layer 151, the first tunnel junction 160, the second common confining layer 152, the third waveguide layer 171, the second active layer 180, the fourth waveguide layer 172, the upper confining layer 190, and the ohmic contact semiconductor layer 200. A first vertical axis and a second vertical axis are provided in FIG. 2. The first vertical axis is located on the left side in FIG. 2, the second vertical axis is located on the right side in FIG. 2, the first vertical axis represents a refractive index, and the second vertical axis represents an optical field. The thickness of the first quantum well layer ranges from 1 micrometer to 10 micrometers. The extremely narrow first quantum well layer does not have crosstalk impact on an optical field in the first active layer 140 and an optical field in the second active layer 180.

Correspondingly, this embodiment further provides a method for manufacturing a multi-active area semiconductor structure, including: providing a semiconductor substrate layer 100; sequentially forming the first active layer 140 to an $N^{th}$ active layer on the semiconductor substrate layer 100, where N is an integer greater than or equal to 2; forming a $k^{th}$ tunnel junction before a $(k+1)^{th}$ active layer is formed, where k is greater than or equal to 1 and less than or equal to N−1; and the step of forming a $k^{th}$ tunnel junction includes: sequentially forming a $k^{th}$ first-semiconductor layer, a $k^{th}$ quantum well layer, and a $k^{th}$ second-semiconductor layer on a side of a $k^{th}$ active layer away from the semiconductor substrate layer 100, the $k^{th}$ first-semiconductor layer and the $k^{th}$ second-semiconductor layer are of opposite conductivity types, and a forbidden band width of the $k^{th}$ quantum well layer is less than both a forbidden band width of the $k^{th}$ first-semiconductor layer and a forbidden band width of the $k^{th}$ second-semiconductor layer; forming a $(2k-1)^{th}$ common confining layer on the side of the $k^{th}$ active layer away from the semiconductor substrate layer 100 before the $k^{th}$ tunnel junction is formed, where, after the $k^{th}$ tunnel junction is formed, the $(2k-1)^{th}$ common confining layer is in contact with the $k^{th}$ tunnel junction; and forming a $2k^{th}$ common confining layer on a side of the $k^{th}$ tunnel junction away from the semiconductor substrate layer 100 before the $(k+1)^{th}$ active layer is formed, where the $2k^{th}$ common confining layer is in contact with the $k^{th}$ tunnel junction, and a conductivity type of the $2k^{th}$ common confining layer is opposite to a conductivity type of the $(2k-1)^{th}$ common confining layer and the same as the conductivity type of the $k^{th}$ second-semiconductor layer, where a total thickness of the $(2k-1)^{th}$ common confining layer and the $2k^{th}$ common confining layer is greater than a critical optical field coupling thickness and less than or equal to twice the critical optical field coupling thickness; and a thickness of the $k^{th}$ quantum well layer is less than or equal to 1/10 of a thickness of the $(2k-1)^{th}$ common confining layer, and the thickness of the $k^{th}$ quantum well layer is less than or equal to 1/10 of a thickness of the $2k^{th}$ common confining layer.

The method for manufacturing a multi-active area semiconductor structure further includes: forming a lower confining layer 120 on the semiconductor substrate layer 100 before the first active layer 140 is formed; forming a first waveguide layer 131 on a side of the lower confining layer 120 away from the semiconductor substrate layer 100 before the first active layer 140 is formed; forming a $2k^{th}$ waveguide layer on the side of the $k^{th}$ active layer away from the semiconductor substrate layer 100 before the $(2k-1)^{th}$ common confining layer is formed; forming a $(2k+1)^{th}$ waveguide layer on a side of the $2k^{th}$ common confining layer away from the semiconductor substrate layer 100 before the $(k+1)^{th}$ active layer is formed; and forming an upper confining layer 190 on a side of the $N^{th}$ active layer away from the semiconductor substrate layer 100. forming an ohmic contact semiconductor layer 200 on a side of the upper confining layer 190 away from the semiconductor substrate layer 100.

In this embodiment, an example in which N is equal to 2 is used for description.

When N is equal to 2, a method for forming the multi-active area semiconductor structure includes: providing a semiconductor substrate layer 100; forming a buffer layer 101 on the semiconductor substrate layer 100; forming a lower confining layer 120 on a side of the buffer layer 101 away from the semiconductor substrate layer 100; forming a first waveguide layer 131 on a side of the lower confining layer 120 away from the semiconductor substrate layer 100;

forming a first active layer 140 on a side of the first waveguide layer 131 away from the semiconductor substrate layer 100; forming a second waveguide layer 132 on a side of the first active layer 140 away from the semiconductor substrate layer 100; forming a first common confining layer 151 on a side of the second waveguide layer 132 away from the semiconductor substrate layer 100; and forming a first tunnel junction 160 on a side of the first common confining layer 151 away from the first active layer 140 and in contact with the first common confining layer 151, where a method for forming the first tunnel junction 160 includes: sequentially forming a first first-semiconductor layer, a first quantum well layer, and a first second-semiconductor layer, the first first-semiconductor layer and the first second-semiconductor layer have opposite conductivity types, a forbidden band width of the first quantum well layer is less than both a forbidden band width of the first first-semiconductor layer and a forbidden band width of the first second-semiconductor layer, and the first first-semiconductor layer is in contact with the first common confining layer 151; forming a second common confining layer 152 on a side of the first tunnel junction 160 away from the first active layer 140 and in contact with the first tunnel junction 160, where the second common confining layer 152 is in contact with the first second-semiconductor layer; forming a third waveguide layer 171 on a side of the second common confining layer 152 away from the first tunnel junction 160; forming a second active layer 180 on a side of the third waveguide layer 171 away from the second common confining layer 152; forming a fourth waveguide layer 172 on a side of the second active layer 180 away from the third waveguide layer 171; forming an upper confining layer 190 on a side of the fourth waveguide layer 172 away from the second active layer 180; and forming an ohmic contact semiconductor layer 200 on a side of the upper confining layer 190 away from the second active layer 180.

In other embodiments, N may be another integer greater than or equal to 3.

In an embodiment, doped ions in the formed $k^{th}$ quantum well layer are Te ions. Correspondingly, referring to FIG. 3, the step of forming a $k^{th}$ quantum well layer includes: sequentially and consecutively performing a first stage and a second stage, where a temperature in the first stage is constant, a temperature in the second stage increases as a growth time increases, and a temperature at a starting moment of the second stage is the same as the temperature in the first stage; and a flow rate of a Te doping gas source in a chamber in the first stage is constant, a flow rate of the Te doping gas source in the chamber in the second stage decreases as the growth time increases, and a flow rate of the Te doping gas source at the starting moment of the second stage is the same as the flow rate of the Te doping gas source in the first stage; and the method for manufacturing the multi-active area semiconductor structure further includes: introducing the Te doping gas source into the chamber in an end stage of forming the $k^{th}$ first-semiconductor layer, where a flow rate of the Te doping gas source introduced into the chamber increases as the growth time increases, and a flow rate of the Te doping gas source corresponding to an end moment of the end stage of forming the $k^{th}$ first-semiconductor layer is the same as the flow rate of the Te doping gas source in the first stage.

In a specific embodiment, the temperature in the second stage linearly increases as the growth time increases, and the flow rate of the Te doping gas source in the chamber in the second stage linearly decreases as the growth time increases. In the end stage of forming the $k^{th}$ first-semiconductor layer, the flow rate of the Te doping gas source introduced in the chamber linearly increases as the growth time increases.

In the end stage of forming the $k^{th}$ first-semiconductor layer, the Te doping gas source is introduced in the chamber. A relaxation process of the Te doping gas source occurs before the first stage instead of in the first stage. Therefore, even if the Te doping gas source has a memory effect, that is, the Te doping gas source has a relaxation effect, the uniformity of the doping concentration in the $k^{th}$ quantum well layer can still be ensured in a process of performing the first stage, thereby avoiding the trend that the doping concentrations in film layers grown in the first stage increase. That is, it can be ensured that the doping concentrations in the film layers grown in the first stage are uniform in this embodiment. Especially the doping concentration in the first quantum well layer at the interface in contact with the $k^{th}$ first-semiconductor layer is relatively high, and the doping is steep between the $k^{th}$ first-semiconductor layer and the first quantum well layer. In the second stage, as the time increases, the temperature in the chamber keeps being increased, and the flow rate of the Te doping gas source is gradually decreased until a valve is closed. In the second stage, as the time increases, the temperature in the chamber keeps being increased, to enable the Te doping gas source attached on a chamber wall of the chamber to be desorbed and leave the chamber wall of the chamber, so that in a process of forming the $2k^{th}$ common confining layer, an extra Te doping gas source is prevented from being doped and entering the $2k^{th}$ common confining layer, to avoid that the concentration of N-type doped ions in the $2k^{th}$ common confining layer is uncontrollable.

Figure 3:
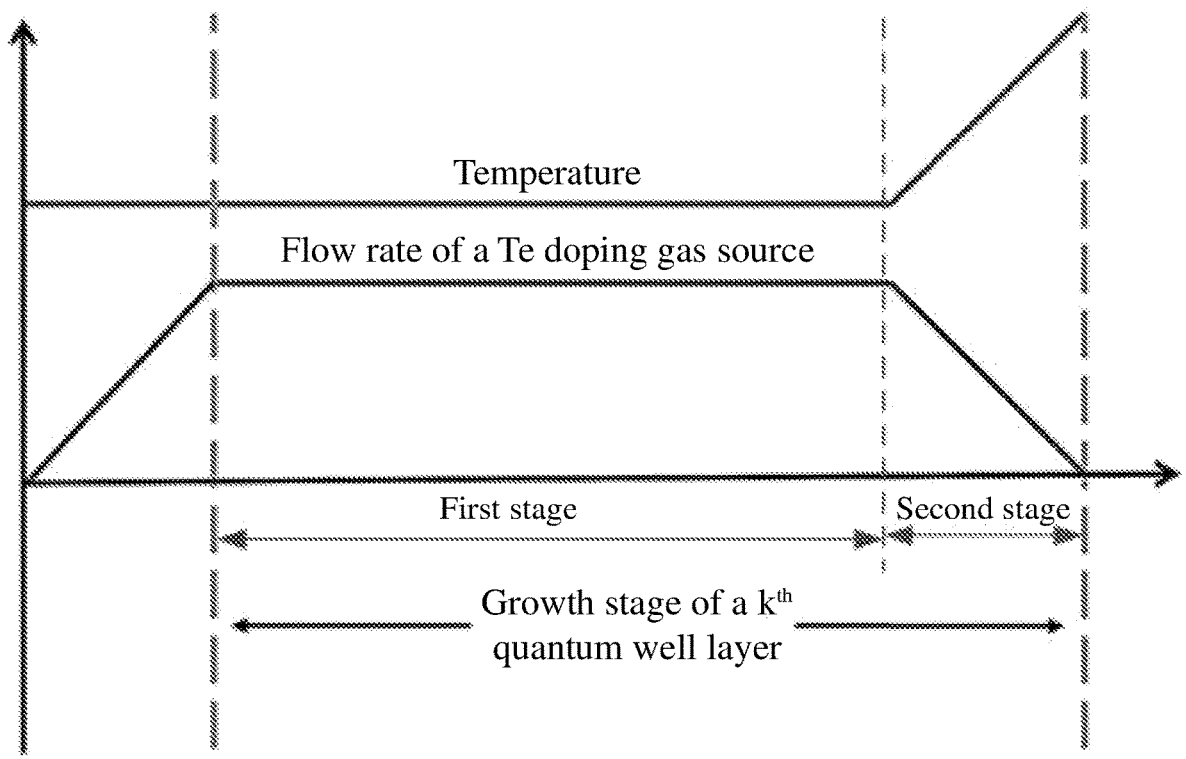
FIG. 3 is a schematic diagram of the temperature and the flow rate of a Te doping gas source in a growth process of a $k^{th}$ quantum well layer in a multi-active area semiconductor structure according to an embodiment of the present application.

Referring to FIG. 3, a growth temperature of the $k^{th}$ first-semiconductor layer is equal to a temperature in the first stage.

N-type conductive ions doped in the $k^{th}$ second-semiconductor layer include Si ions, Te ions or a combination thereof.

It needs to be noted that in the end stage of forming the $k^{th}$ first-semiconductor layer, the Te doping gas source has a relaxation effect. Therefore, the Te doping gas source is not doped in the $k^{th}$ first-semiconductor layer in the end stage of forming the $k^{th}$ first-semiconductor layer.

In an embodiment, a duration of the end stage of forming the $k^{th}$ first-semiconductor layer ranges from 1 second to 30 seconds, for example, 1 second, 5 seconds, 10 seconds, 20 seconds or 30 seconds.

In an embodiment, a duration of the first stage is 30 seconds to 1 minute, and the duration of the first stage changes according to the thickness of the $k^{th}$ quantum well layer.

In an embodiment, a duration of the second stage ranges from 30 seconds to 1 minute.

In an embodiment, a temperature at a termination moment of the second stage is increased by 10% to 30% with respect to the temperature at the starting moment of the second stage, for example, by 10%, 15%, 20%, 25% or 30%.

In an embodiment, the temperature in the second stage ranges from 550 degrees Celsius to 650 degrees Celsius, and the temperature in the first stage ranges from 550 degrees Celsius to 610 degrees Celsius.

In an embodiment, a flow rate of the Te doping gas source corresponding to a termination moment of the second stage is zero; and the flow rate of the Te doping gas source introduced in the end stage of forming the $k^{th}$ first-semiconductor layer increases from zero until becoming the same as the flow rate of the Te doping gas source in the first stage.

In an embodiment, the flow rate of the Te doping gas source in the first stage ranges from 10 sccm to 20 sccm.

In another embodiment, doped ions in the $k^{th}$ quantum well layer are Te ions, and Te ions are doped in the $k^{th}$ second-semiconductor layer. Correspondingly, referring to FIG. 4, in a process of forming the $k^{th}$ quantum well layer, a temperature is constant and a flow rate of a Te doping gas source is constant; the step of forming a $k^{th}$ second-semiconductor layer includes: sequentially and consecutively performing a third stage and a fourth stage, where a temperature in the third stage is constant, a temperature in the fourth stage increases as a growth time increases, and a temperature at a starting moment of the fourth stage is the same as the temperature in the third stage; and a flow rate of the Te doping gas source in a chamber in the third stage is constant, a flow rate of the Te doping gas source in the chamber in the fourth stage decreases as the growth time increases, and a flow rate of the Te doping gas source at the starting moment of the fourth stage is the same as the flow rate of the Te doping gas source in the third stage; and the method for manufacturing the multi-active area semiconductor structure further includes: introducing the Te doping gas source into the chamber in an end stage of forming the $k^{th}$ first-semiconductor layer, where a flow rate of the Te doping gas source introduced into the chamber increases as the growth time increases, and a flow rate of the Te doping gas source corresponding to an end moment of the end stage of forming the $k^{th}$ first-semiconductor layer is the same as the flow rate of the Te doping gas source used in the process of forming the $k^{th}$ quantum well layer. In a specific embodiment, the temperature in the fourth stage linearly increases as the growth time increases, and the flow rate of the Te doping gas source in the chamber in the fourth stage linearly decreases as the growth time increases. In the end stage of forming the $k^{th}$ first-semiconductor layer, the flow rate of the Te doping gas source introduced in the chamber linearly increases as the growth time increases.

Figure 4:
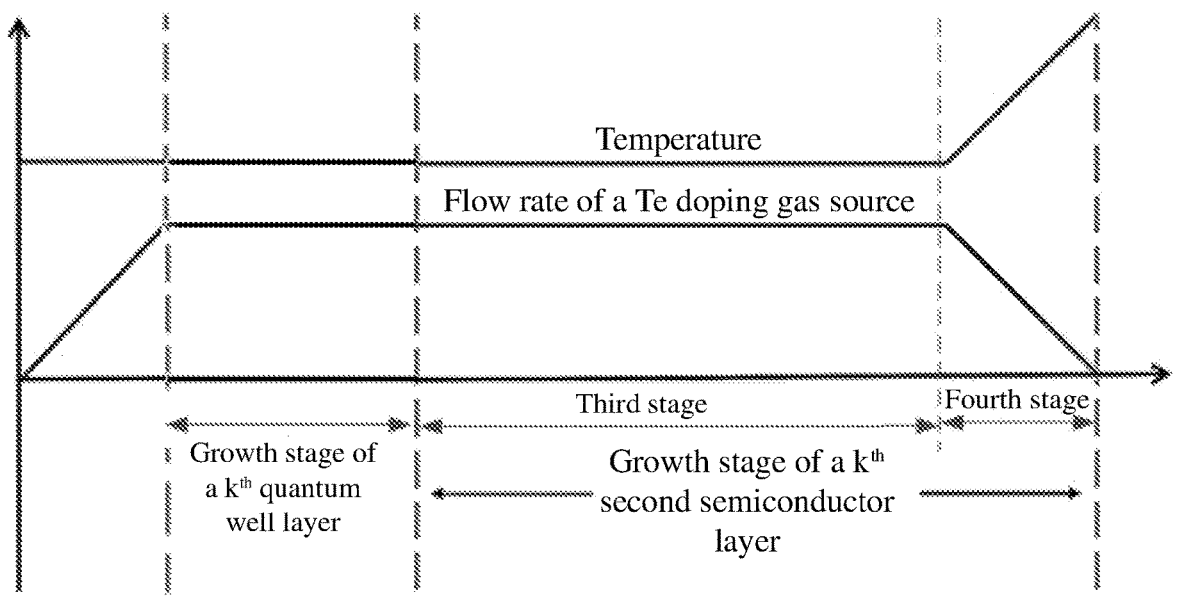
FIG. 4 is a schematic diagram of the temperature and the flow rate of a Te doping gas source in a growth process of a $k^{th}$ quantum well layer and a $k^{th}$ second-semiconductor layer in a multi-active area semiconductor structure according to another embodiment of the present application.

Referring to FIG. 4, the growth temperature of the $k^{th}$ first-semiconductor layer, the growth temperature of the $k^{th}$ quantum well layer, and the temperature in the third stage are consistent. In an embodiment, a temperature at a termination moment of the fourth stage is increased by 10% to 30% with respect to the temperature at the starting moment of the third stage, for example, by 10%, 15%, 20%, 25% or 30%. The temperature in the fourth stage ranges from 550 degrees Celsius to 650 degrees Celsius, and the temperature in the third stage ranges from 550 degrees Celsius to 610 degrees Celsius. A flow rate of the Te doping gas source corresponding to a termination moment of the fourth stage is zero; and the flow rate of the Te doping gas source introduced in the end stage of forming the $k^{th}$ first-semiconductor layer increases from zero until becoming the same as the flow rate of the Te doping gas source used for forming the $k^{th}$ quantum well layer. The flow rate of the Te doping gas source in the third stage ranges from 10 sccm to 20 sccm. A duration of the fourth stage ranges from 30 seconds to 1 minute. The duration of the end stage of forming the $k^{th}$ first-semiconductor layer ranges from 1 second to 30 seconds, for example, 1 second, 5 seconds, 10 seconds, 20 seconds or 30 seconds.

Obviously, the foregoing embodiments are merely examples for clear description, rather than a limitation to implementations. For a person of ordinary skill in the art, other changes or variations in different forms may also be made based on the foregoing description. All implementations cannot and do not need to be exhaustively listed herein. Obvious changes or variations that are derived there from still fall within the protection scope of present application.

The invention claimed is:

1. A multi-active area semiconductor structure, comprising:
   a semiconductor substrate layer;
   a first active layer to an $N^{th}$ active layer arranged on the semiconductor substrate layer, wherein N is an integer greater than or equal to 2;
   a $k^{th}$ tunnel junction arranged between a $k^{th}$ active layer and a $(k+1)^{th}$ active layer, wherein k is greater than or equal to 1 and less than or equal to N−1; and the $k^{th}$ tunnel junction comprises a $k^{th}$ first-semiconductor layer and a $k^{th}$ second-semiconductor layer that are of opposite conductivity types and a $k^{th}$ quantum well layer, the $k^{th}$ second-semiconductor layer is arranged on a side of the $k^{th}$ first-semiconductor layer away from the $k^{th}$ active layer, the $k^{th}$ quantum well layer is arranged between the $k^{th}$ second-semiconductor layer and the $k^{th}$ first-semiconductor layer, and a forbidden band width of the $k^{th}$ quantum well layer is less than both a forbidden band width of the $k^{th}$ first-semiconductor layer and a forbidden band width of the $k^{th}$ second-semiconductor layer;
   a $(2k-1)^{th}$ common confining layer arranged between the $k^{th}$ active layer and the $k^{th}$ tunnel junction, wherein the $(2k-1)^{th}$ common confining layer is in contact with the $k^{th}$ tunnel junction; and
   a $2k^{th}$ common confining layer arranged between the $(k+1)^{th}$ active layer and the $k^{th}$ tunnel junction, wherein the $2k^{th}$ common confining layer is in contact with the $k^{th}$ tunnel junction, and a conductivity type of the $2k^{th}$ common confining layer is opposite to a conductivity type of the $(2k-1)^{th}$ common confining layer and the same as the conductivity type of the $k^{th}$ second-semiconductor layer, wherein
   a total thickness of the $(2k-1)^{th}$ common confining layer and the $2k^{th}$ common confining layer is greater than a critical optical field coupling thickness and less than or equal to twice the critical optical field coupling thickness; and a thickness of the $k^{th}$ quantum well layer is less than or equal to $1/10$ of a thickness of the $(2k-1)^{th}$ common confining layer, and the thickness of the $k^{th}$ quantum well layer is less than or equal to $1/10$ of a thickness of the $2k^{th}$ common confining layer.

2. The multi-active area semiconductor structure according to claim 1, wherein the $(2k-1)^{th}$ common confining layer is used for confining optical fields in the $k^{th}$ active layer and the $(k+1)^{th}$ active layer, and the $2k^{th}$ common confining layer is used for confining the optical fields in the $(k+1)^{th}$ active layer and the $k^{th}$ active layer.

3. The multi-active area semiconductor structure according to claim 1, wherein the critical optical field coupling thickness ranges from 0.3 micrometers to 5 micrometers.

4. The multi-active area semiconductor structure according to claim 1, wherein the total thickness of the $(2k-1)^{th}$ common confining layer and the $2k^{th}$ common confining layer ranges from 0.4 micrometers to 6 micrometers.

5. The multi-active area semiconductor structure according to claim 1, wherein the thickness of the $k^{th}$ quantum well layer is less than or equal to 10 nanometers.

6. The multi-active area semiconductor structure according to claim 1, wherein a doping concentration in the $k^{th}$ quantum well layer is greater than a doping concentration in the $(2k-1)^{th}$ common confining layer and greater than a doping concentration in the $2k^{th}$ common confining layer.

7. The multi-active area semiconductor structure according to claim 6, wherein the doping concentration in the $k^{th}$ quantum well layer ranges from 5 E18 atom/cm$^3$ to 1 E20 atom/cm$^3$.

8. The multi-active area semiconductor structure according to claim 1, wherein a material of the $k^{th}$ first-semiconductor layer is the same as a material of the $(2k-1)^{th}$ common confining layer; and a material of the $k^{th}$ second-semiconductor layer is the same as a material of the $2k^{th}$ common confining layer.

9. The multi-active area semiconductor structure according to claim 8, wherein when the semiconductor substrate layer is a GaAs substrate, the material of the $k^{th}$ first-semiconductor layer and the $(2k-1)^{th}$ common confining layer is $Al_{x1}Ga_{1-x1}As$, $(Al_{x2}Ga_{1-x2})_{0.51}In_{0.49}P$ or $In_{1-x3}Ga_{x3}As_{y1}P_{1-y1}$ doped with P-type conductive ions, and the material of the $k^{th}$ second-semiconductor layer and the $2k^{th}$ common confining layer is $Al_{x1}Ga_{1-x1}As$, $(Al_{x2}Ga_{1-x2})_{0.51}In_{0.49}P$ or $In_{1-x3}Ga_{x3}As_{y1}P_{1-y1}$ doped with N-type conductive ions; and when the semiconductor substrate layer is an InP substrate, the material of the $k^{th}$ first-semiconductor layer and the $(2k-1)^{th}$ common confining layer is InP, $In_{0.53}(Al_{x4}Ga_{1-x4})_{0.47}As$ or $In_{1-x5}Ga_{x5}As_{y2}P_{1-y2}$ doped with P-type conductive ions, and the material of the $k^{th}$ second-semiconductor layer and the $2k^{th}$ common confining layer is InP, $In_{0.53}(Al_{x4}Ga_{1-x4})_{0.47}As$ or $In_{1-x5}Ga_{x5}As_{y2}P_{1-y2}$ doped with N-type conductive ions.

10. The multi-active area semiconductor structure according to claim 1, wherein a conductivity type of the $k^{th}$ quantum well layer is an N type, and doped ions in the $k^{th}$ quantum well layer are Te ions or Si ions.

11. The multi-active area semiconductor structure according to claim 10, wherein a material of the $k^{th}$ quantum well layer is $In_yGa_{1-y}As$ doped with Te ions or Si ions.

12. The multi-active area semiconductor structure according to claim 1, further comprising: a lower confining layer arranged between the semiconductor substrate layer and the first active layer; an upper confining layer arranged on a side of the $N^{th}$ active layer away from the semiconductor substrate layer; a first waveguide layer arranged between the first active layer and the lower confining layer; a $2k^{th}$ waveguide layer arranged between the $k^{th}$ active layer and the $(2k-1)^{th}$ common confining layer; and a $(2k+1)^{th}$ waveguide layer arranged between the $(k+1)^{th}$ active layer and the $2k^{th}$ common confining layer.

13. A method for manufacturing the multi-active area semiconductor structure according to claim 1, comprising:
   providing a semiconductor substrate layer;
   sequentially forming a first active layer to an $N^{th}$ active layer on the semiconductor substrate layer, wherein N is an integer greater than or equal to 2;
   forming a $k^{th}$ tunnel junction before a $(k+1)^{th}$ active layer is formed, wherein k is greater than or equal to 1 and less than or equal to N-1; and the step of forming a $k^{th}$ tunnel junction comprises: sequentially forming a $k^{th}$ first-semiconductor layer, a $k^{th}$ quantum well layer, and a $k^{th}$ second-semiconductor layer on a side of a $k^{th}$ active layer away from the semiconductor substrate layer, the $k^{th}$ first-semiconductor layer and the $k^{th}$ second-semiconductor layer are of opposite conductivity types, and a forbidden band width of the $k^{th}$ quantum well layer is less than both a forbidden band width of the $k^{th}$ first-semiconductor layer and a forbidden band width of the $k^{th}$ second-semiconductor layer;
   forming a $(2k-1)^{th}$ common confining layer on the side of the $k^{th}$ active layer away from the semiconductor substrate layer before the $k^{th}$ tunnel junction is formed, wherein, after the $k^{th}$ tunnel junction is formed, the $(2k-1)^{th}$ common confining layer is in contact with the $k^{th}$ tunnel junction; and
   forming a $2k^{th}$ common confining layer on a side of the $k^{th}$ tunnel junction away from the semiconductor substrate layer before the $(k+1)^{th}$ active layer is formed, wherein the $2k^{th}$ common confining layer is in contact with the $k^{th}$ tunnel junction, and a conductivity type of the $2k^{th}$ common confining layer is opposite to a conductivity type of the $(2k-1)^{th}$ common confining layer and the same as the conductivity type of the $k^{th}$ second-semiconductor layer, wherein
   a total thickness of the $(2k-1)^{th}$ common confining layer and the $2k^{th}$ common confining layer is greater than a critical optical field coupling thickness and less than or equal to twice the critical optical field coupling thickness; and a thickness of the $k^{th}$ quantum well layer is less than or equal to 1/10 of a thickness of the $(2k-1)^{th}$ common confining layer, and the thickness of the $k^{th}$ quantum well layer is less than or equal to 1/10 of a thickness of the $2k^{th}$ common confining layer.

14. The method for manufacturing the multi-active area semiconductor structure according to claim 13, wherein the $(2k-1)^{th}$ common confining layer is used for confining optical fields in the $k^{th}$ active layer and the $(k+1)^{th}$ active layer, and the $2k^{th}$ common confining layer is used for confining the optical fields in the $(k+1)^{th}$ active layer and the $k^{th}$ active layer.

15. The method for manufacturing the multi-active area semiconductor structure according to claim 13, wherein doped ions in the $k^{th}$ quantum well layer are Te ions;
   the step of forming a $k^{th}$ quantum well layer comprises: sequentially and consecutively performing a first stage and a second stage, wherein a temperature in the first stage is constant, a temperature in the second stage increases as a growth time increases, and a temperature at a starting moment of the second stage is the same as the temperature in the first stage; and a flow rate of a Te doping gas source in a chamber in the first stage is constant, a flow rate of the Te doping gas source in the chamber in the second stage decreases as the growth time increases, and a flow rate of the Te doping gas source at the starting moment of the second stage is the same as the flow rate of the Te doping gas source in the first stage; and
   the method for manufacturing the multi-active area semiconductor structure further comprises: introducing the Te doping gas source into the chamber in an end stage of forming the $k^{th}$ first-semiconductor layer, wherein a flow rate of the Te doping gas source introduced into the chamber increases as the growth time increases, and a flow rate of the Te doping gas source corresponding to an end moment of the end stage of forming the $k^{th}$ first-semiconductor layer is the same as the flow rate of the Te doping gas source in the first stage.

16. The method for manufacturing the multi-active area semiconductor structure according to claim 15, wherein a duration of the end stage of forming the $k^{th}$ first-semiconductor layer ranges from 1 second to 30 seconds; and a duration of the second stage ranges from 30 seconds to 1 minute.

17. The method for manufacturing the multi-active area semiconductor structure according to claim 15, wherein a temperature at a termination moment of the second stage is increased by 10% to 30% with respect to the temperature at the starting moment of the second stage.

18. The method for manufacturing the multi-active area semiconductor structure according to claim 15, wherein a flow rate of the Te doping gas source corresponding to a termination moment of the second stage is zero; and the flow rate of the Te doping gas source introduced in the end stage of forming the $k^{th}$ first-semiconductor layer increases from zero until becoming the same as the flow rate of the Te doping gas source in the first stage.

19. The method for manufacturing the multi-active area semiconductor structure according to claim 13, wherein doped ions in the $k^{th}$ quantum well layer are Te ions, and Te ions are doped in the $k^{th}$ second-semiconductor layer;

in a process of forming the $k^{th}$ quantum well layer, a temperature is constant and a flow rate of a Te doping gas source is constant;

the step of forming a $k^{th}$ second-semiconductor layer comprises: sequentially and consecutively performing a third stage and a fourth stage, wherein a temperature in the third stage is constant, a temperature in the fourth stage increases as a growth time increases, and a temperature at a starting moment of the fourth stage is the same as the temperature in the third stage; and a flow rate of the Te doping gas source in a chamber in the third stage is constant, a flow rate of the Te doping gas source in the chamber in the fourth stage decreases as the growth time increases, and a flow rate of the Te doping gas source at the starting moment of the fourth stage is the same as the flow rate of the Te doping gas source in the third stage; and the method for manufacturing the multi-active area semiconductor structure further comprises: introducing the Te doping gas source into the chamber in an end stage of forming the $k^{th}$ first-semiconductor layer, wherein a flow rate of the Te doping gas source introduced into the chamber increases as the growth time increases, and a flow rate of the Te doping gas source corresponding to an end moment of the end stage of forming the $k^{th}$ first-semiconductor layer is the same as the flow rate of the Te doping gas source used in the process of forming the $k^{th}$ quantum well layer.

20. The method for manufacturing the multi-active area semiconductor structure according to claim 13, further comprising: forming a lower confining layer on the semiconductor substrate layer before the first active layer is formed; forming a first waveguide layer on a side of the lower confining layer away from the semiconductor substrate layer; forming a $2k^{th}$ waveguide layer on the side of the $k^{th}$ active layer away from the semiconductor substrate layer before the $(2k-1)^{th}$ common confining layer is formed; forming a $(2k+1)^{th}$ waveguide layer on a side of the $2k^{th}$ common confining layer away from the semiconductor substrate layer before the $(k+1)^{th}$ active layer is formed; and forming an upper confining layer on a side of the $N^{th}$ active layer away from the semiconductor substrate layer.

* * * * *